United States Patent
Kim et al.

(10) Patent No.: US 7,276,443 B2
(45) Date of Patent: Oct. 2, 2007

(54) METHOD FOR FORMING METAL WIRING IN SEMICONDUCTOR DEVICE

(75) Inventors: Soo Hyun Kim, Seoul (KR); Jun Ki Kim, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 11/134,640

(22) Filed: May 20, 2005

(65) Prior Publication Data

US 2006/0115977 A1 Jun. 1, 2006

(30) Foreign Application Priority Data

Nov. 30, 2004 (KR) .................... 10-2004-0099138

(51) Int. Cl.
*H01L 21/44* (2006.01)
(52) U.S. Cl. .................. 438/680; 257/E21.17
(58) Field of Classification Search ............... 438/653, 438/656, 672, 675, 680, 683, 652, 685, 648
See application file for complete search history.

(56) References Cited

U.S. PATENT DOCUMENTS

| | | | | |
|---|---|---|---|---|
| 5,956,609 A | * | 9/1999 | Lee et al. | 438/627 |
| 6,206,967 B1 | | 3/2001 | Mak et al. | |
| 6,251,190 B1 | * | 6/2001 | Mak et al. | 118/715 |
| 6,465,347 B2 | * | 10/2002 | Ishizuka et al. | 438/648 |
| 6,905,543 B1 | | 6/2005 | Fair et al. | |
| 2003/0153181 A1 | * | 8/2003 | Yoon et al. | 438/685 |
| 2003/0190802 A1 | * | 10/2003 | Wang et al. | 438/672 |
| 2003/0194493 A1 | * | 10/2003 | Chang et al. | 427/248.1 |
| 2004/0202786 A1 | * | 10/2004 | Wongsenakhum et al. | 427/250 |

FOREIGN PATENT DOCUMENTS

| | | |
|---|---|---|
| KR | 19990055159 | 7/1999 |
| KR | 10-20040086858 | 10/2004 |

* cited by examiner

*Primary Examiner*—Quoc Hoang
(74) *Attorney, Agent, or Firm*—Ladas & Parry LLP

(57) ABSTRACT

Disclosed is a method for forming a metal wiring in a semiconductor device in order to improve the operational speed of the semiconductor device. The method includes the steps of depositing an interlayer dielectric film on a silicon substrate, in which the interlayer dielectric film has a contact hole for exposing a predetermined portion of the silicon substrate, depositing a barrier layer on the interlayer dielectric film having the contact hole, depositing a first tungsten layer on the barrier layer by using $SiH_4$ as a reaction gas, depositing a second tungsten layer on the first tungsten layer by using $B_2H_6$ as a reaction gas, depositing a third tungsten layer on the second tungsten layer in such a manner that the contact hole is filled with the third tungsten layer, and selectively etching the third tungsten layer, the second tungsten layer, the first tungsten layer, and the barrier layer, thereby forming the metal wiring.

20 Claims, 5 Drawing Sheets

METHOD FOR FORMING METAL WIRING IN SEMICONDUCTOR DEVICE

BACKGROUND OF THE INVENTION

1. Field of the Invention

The present invention relates to a method for fabricating a semiconductor device, and more particularly to a method for forming a metal wiring in a semiconductor device in order to improve an operational speed of the semiconductor device.

2. Description of the Prior Art

As generally known in the art, aluminum or tungsten is mainly used as a material for a metal wiring. In particular, since a tungsten layer, which is deposited on a substrate through a chemical vapor deposition (CVD) process, represents the superior gap-filling characteristic and the low resistivity, the tungsten layer is mainly used for fabricating highly integrated semiconductor devices.

FIGS. 1a and 1b are cross-sectional views illustrating a conventional procedure for forming a metal wiring in a semiconductor device.

As shown in FIG. 1a, an interlayer dielectric film 11 is formed on a silicon substrate 10 having a predetermined base structure and a contact hole 12 for exposing a predetermined portion of the silicon substrate 10 is formed by selectively etching the interlayer dielectric film 11. In addition, a barrier layer 13 is formed on the interlayer dielectric film 11 including the contact hole 12. The barrier layer 13 has a stacked structure including a Ti layer and a TiN layer stacked on the Ti layer. Then, the silicon substrate 10 formed with the barrier layer 13 is subject to the rapid heat-treatment process, thereby forming a $TiSi_x$ layer 14 on an interfacial surface between the barrier layer 13 and the silicon substrate 10.

After that, a first tungsten layer 15 is formed on the barrier layer 13. When forming the first tungsten layer 15 on the barrier layer 13, $WF_6$ is used as a source gas and $SiH_4$ is used as a reaction gas for the first tungsten layer 15. Then, a second tungsten layer 16, that is, a tungsten bulk layer is formed on the first tungsten layer 15 in such a manner that the contact hole 12 is filled with the second tungsten layer 16. When forming the second tungsten layer 16 on the first tungsten layer 15, $WF_6$ is used as a source gas and $H_2$ is used as a reaction gas for the second tungsten layer 16.

As shown in FIG. 1b, a metal wiring 17 is formed by selectively etching the second tungsten layer 16, the first tungsten layer 15, and the barrier layer 13. Reference numerals 13a, 15a and 16a represent a remaining barrier layer, a remaining first tungsten layer and a remaining second tungsten layer, respectively, which may remain after the etching process has been completed.

However, as the integration degree of the semiconductor device has been increased, the conventional procedure for forming the metal wiring 17 in the semiconductor device represents a limitation to reduce the resistance of the metal wiring 17 even if tungsten having the low resistivity is used as a material for the metal wiring 17. For this reason, the operational speed of the semiconductor device is significantly reduced.

SUMMARY OF THE INVENTION

Accordingly, the present invention has been made to solve the above-mentioned problems occurring in the prior art, and an object of the present invention is to provide a method for forming a metal wiring in a semiconductor device in order to improve an operational speed of the semiconductor device by reducing the resistance of the metal wiring corresponding to the integration degree of the semiconductor device.

In order to accomplish the above object, according to the present invention, there is provided a method for forming a metal wiring in a semiconductor device, the method comprising the steps of: depositing an interlayer dielectric film on a silicon substrate, the interlayer dielectric film having a contact hole for exposing a predetermined portion of the silicon substrate; depositing a barrier layer on the interlayer dielectric film having the contact hole; depositing a first tungsten layer on the barrier layer by using $SiH_4$ as a reaction gas; depositing a second tungsten layer on the first tungsten layer by using $B_2H_6$ as a reaction gas; depositing a third tungsten layer on the second tungsten layer in such a manner that the contact hole is filled with the third tungsten layer; and selectively etching the third tungsten layer, the second tungsten layer, the first tungsten layer, and the barrier layer, thereby forming the metal wiring.

According to the preferred embodiment of the present invention, the first and second tungsten layers are deposited through an ALD process and the third tunsten layer is deposited through a CVD process According to the preferred embodiment of the present invention, the first and second tungsten layers are deposited in a thickness of about 1 to 10 nm.

According to the preferred embodiment of the present invention, the deposition steps for the first and second tungsten layers are repeated until the first and second tungsten layers have a desired thickness, respectively.

According to the preferred embodiment of the present invention, one selected from the group consisting of $H_2$, $SiH_4$, and a mixture gas thereof is used as a reaction gas for the third tungsten layer.

According to the preferred embodiment of the present invention, the first to third tungsten layers are deposited by using a W-containing gas as a source gas therefor, and the W-containing gas is one selected from the group consisting of $WF_6$, $WCl_6$, $WBr_6$, $W(CO)_6$, $W(C_2H_2)_6$, $W(PF_3)_8$, $W(allyl)_3$, $(C_2H_5)WH_2$, $[CH_3(C_5H_4)]_2WH_2$, $(C_2H_5)W(CO)_3(CH_3)$, $W(butadiene)_3$, $W(methylvinyl-ketone)_3$, $(C_5H_5)HW(CO)_3$, $(C_7H_8)W(CO)_3$, and $(1,5-COD)W(CO)_4$ wherein COD is 1,5 cyclooctadiene.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

FIGS. 2a to 2e are cross-sectional views illustrating a procedure for forming a metal wiring in a semiconductor device according to one embodiment of the present invention.

Figure 1A:
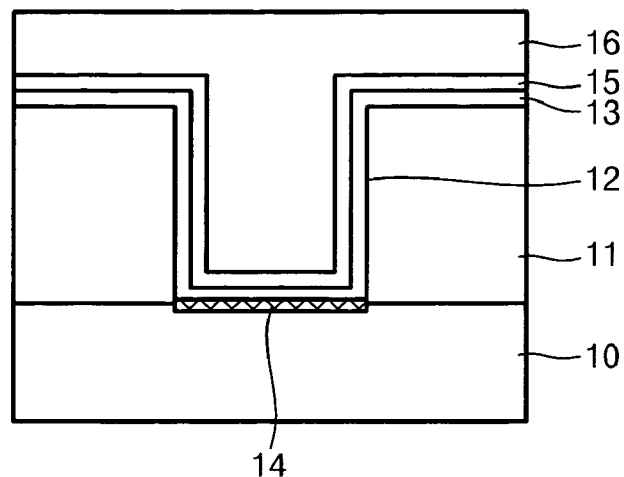
FIGS. 1a and 1b are cross-sectional views illustrating a conventional procedure for forming a metal wiring in a semiconductor device.
Figure 1B:
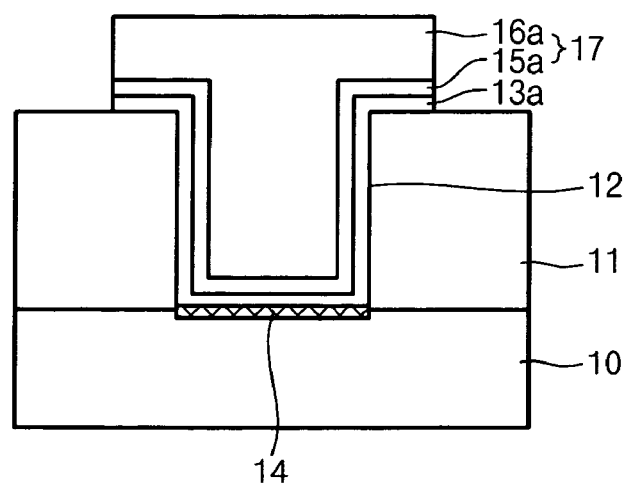
Figure 2A:
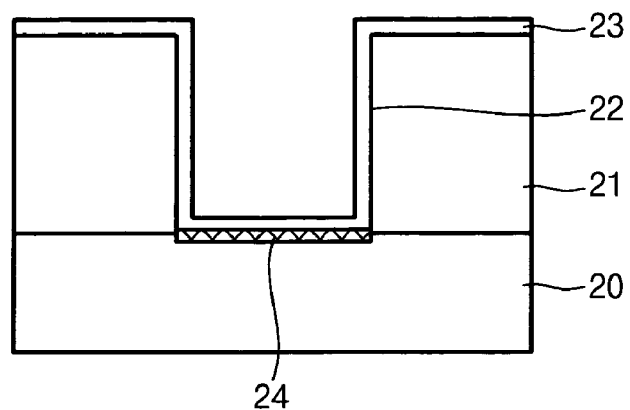
FIGS. 2a to 2e are cross-sectional views illustrating a procedure for forming a metal wiring in a semiconductor device according to one embodiment of the present invention.

As shown in FIG. 2a, an interlayer dielectric film 21 is deposited on a silicon substrate 20 having a predetermined base structure and a contact hole 22 for exposing a predetermined portion of the silicon substrate 20 is formed by selectively etching the interlayer dielectric film 21. In addition, a barrier layer 23 is deposited on the interlayer dielectric film 21 including the contact hole 22. The barrier layer 23 has a stacked structure including a Ti layer and a TiN layer stacked on the Ti layer. Then, the silicon substrate 20 formed with the barrier layer 23 is subject to the rapid heat-treatment process, thereby forming a $TiSi_x$ layer 24 on an interfacial surface between the barrier layer 23 and the silicon substrate 20.

Figure 2B:
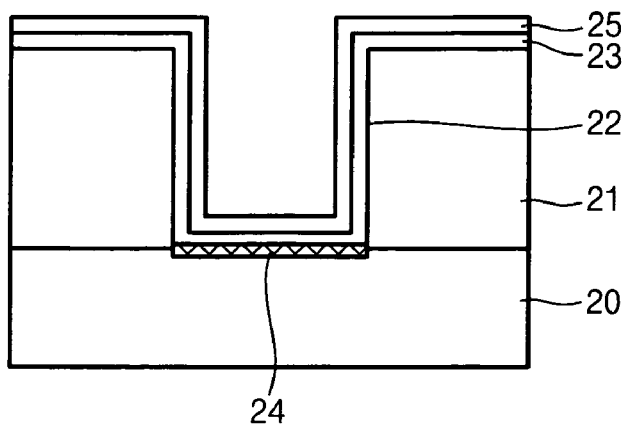

As shown in FIG. 2b, a first tungsten layer 25 is deposited on the barrier layer 23. When forming the first tungsten layer 25 on the barrier layer 23, $WF_6$ is used as a source gas and $SiH_4$ is used as a reaction gas for the first tungsten layer 25. The first tungsten layer 25 is deposited on the barrier layer 23 with a thickness of about 1-10 nm through an ALD (atomic layer deposition) process. The ALD process includes a $SiH_4$ gas dosing step, a purge step, a $WF_6$ gas dosing step, and a purge step, which are sequentially performed and repeated until the first tungsten layer 25 having a desired thickness can be obtained. At this time, $SiH_4$, which is a reaction gas for the first tungsten layer 25, may be fed in the form of gas or plasma. Instead of $SiH_4$, $Si_2H_6$ can be used as a reaction gas for the first tungsten layer 25.

Figure 2C:
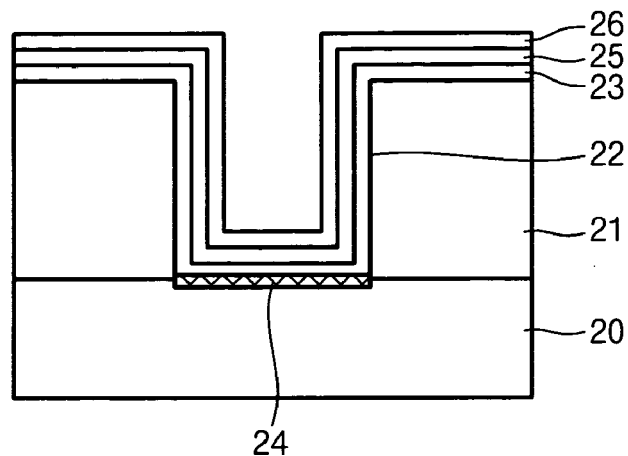
Figure 2D:
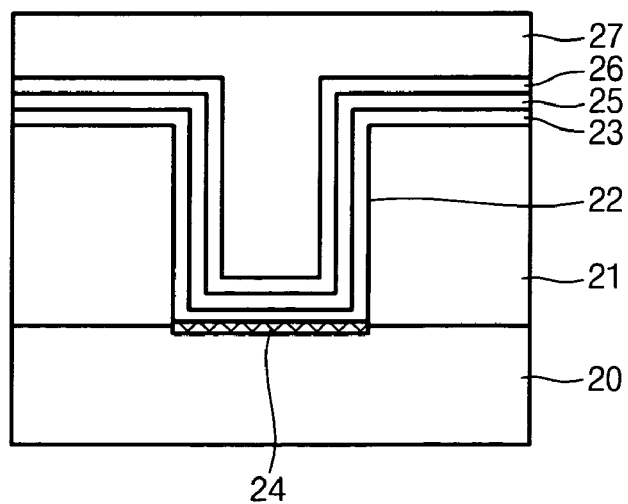

As shown in FIG. 2c, a second tungsten layer 26 is deposited on the first tungsten layer 25. When forming the second tungsten layer 26 on the first tungsten layer 25, $WF_6$ is used as a source gas and $B_2H_6$ is used as a reaction gas for the second tungsten layer 26. The second tungsten layer 26 is deposited on the first tungsten layer 25 with a thickness of about 1-10 nm through the ALD process. The ALD process includes a $B_2H_6$ gas feeding step, a primary purge step, a $WF_6$ gas feeding step, and a secondary purge step, which are sequentially performed and repeated until the second tungsten layer 26 having a desired thickness can be obtained. At this time, $B_2H_6$, which is a reaction gas for the second tungsten layer 26, may be fed in the form of gas or plasma. In addition, after depositing the second tungsten layer 26, a deposition cycle can be repeated in order to sequentially deposit the first and second tungsten layers 25 and 26 until the first and second tungsten layers 25 and 26 have a desired thickness. The first and second tungsten layers 25 and 26 can be deposited through a CVD process. Referring to FIG. 2d, a third tungsten layer 27, that is, a tungsten bulk layer is deposited on the second tungsten layer 26 through the CVD process in such a manner that the contact hole 22 is filled with the third tungsten layer 27. When forming the third tungsten layer 27 on the second tungsten layer 26, $WF_6$ is used as a source gas and one selected from the group consisting of $H_2$, $SiH_4$, and a mixture gas thereof is used as a reaction gas for the third tungsten layer 27. Instead of $WF_6$, one selected from the group consisting of, $WCl_6$, $WBr_6$, $W(CO)_6$, $W(C_2H_2)_6$, $W(PF_3)_6$, $W(allyl)_3$, $(C_2H_5)WH_2$, $[CH_3(C_5H_4)]_2WH_2$, $(C_2H_5)W(CO)_3(CH_3)$, $W(butadiene)_3$, $W(methylvinyl-ketone)_3$, $(C_5H_5)HW(CO)_3$, $(C_7H_8)W(CO)_3$, and $(1,5\text{-}COD)W(CO)_4$ (wherein COD is 1,5 cyclooctadiene) can be used as a source gas for the third tungsten layer 27.

Figure 2E:
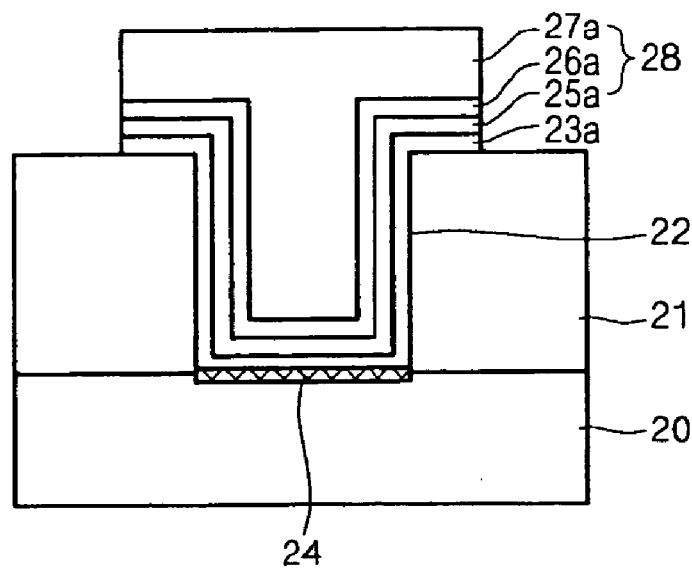

As shown in FIG. 2e, a metal wiring 28 is formed by selectively etching the first and second tungsten layer 25 and 26 and the barrier layer 23. Reference numerals 23a, 25a, 26a and 27a represent a remaining barrier layer, a remaining first tungsten layer, a remaining second tungsten layer and a remaining third tungsten layer, respectively, which may remain after the etching process has been completed.

As described above, after depositing the first tungsten layer 25 on the barrier layer 23 by using the $SiH_4$ gas as a reaction gas for the first tungsten layer 25, the second tungsten layer 26 is deposited on the first tungsten layer 25 by using the $B_2H_6$ gas as a reaction gas for the second tungsten layer 26. Then, the third tungsten layer 27, that is, the tungsten bulk layer is deposited on the second tungsten layer 26, so that the tungsten bulk layer of the present invention has a grain size larger than that of the conventional tungsten bulk layer. The reason will be described below with reference to FIGS. 3a, 3b and 4.

Figure 3A:
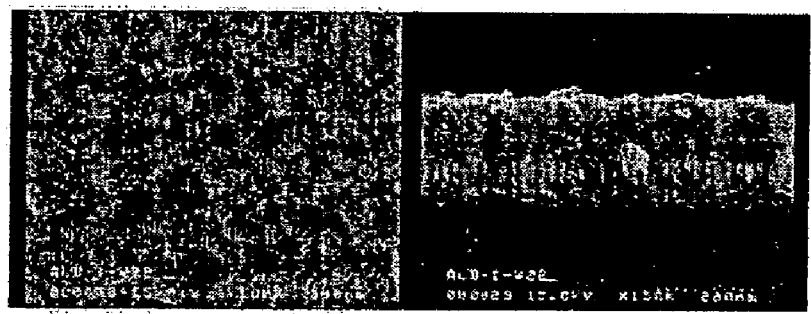
FIGS. 3a and 3b are SEM micrographs illustrating grain size and microstructure of tungsten bulk layers grown on ALD-tungsten layers deposited by using $SiH_4$ and $B_2H_6$ as reaction gases, respectively.

FIG. 3a is an SEM micrographs illustrating the grain size of a CVD-tungsten bulk layer grown through a CVD process from an ALD-tungsten layer deposited by using $SiH_4$ as the reaction gas.

Figure 3B:
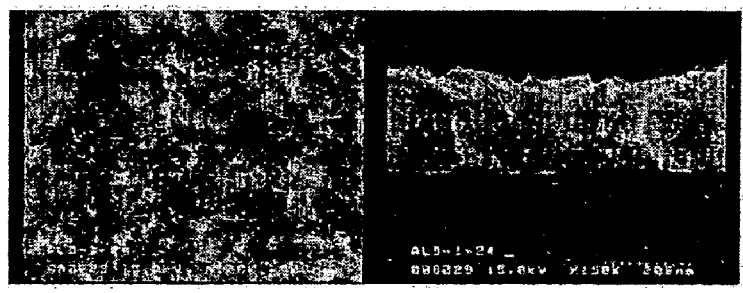
Figure 4:
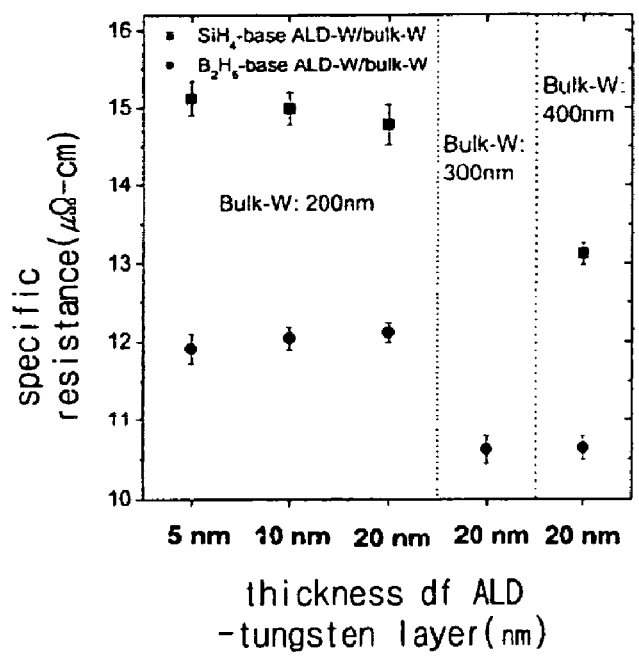
FIG. 4 is a graph illustrating the resistivity of a stacked structure of an ALD-tungsten layer and a tungsten bulk layer as a function of ALD-tungsten film thickness.

FIG. 3b is an SEM photographic view illustrating the structure of a CVD-tungsten bulk layer grown through a CVD process on an ALD-tungsten layer deposited by using $B_2H_6$ as the reaction gas and FIG. 4 is a graph illustrating the resistivity of a stacked structure of the ALD-tungsten layer and the CVD-tungsten bulk layer as a function of ALD-tungsten film thickness.

As can be seen from FIGS. 3a and 3b, the grain size of the CVD-tungsten bulk layer grown on the ALD-tungsten layer deposited by using $B_2H_6$ as the reaction gas is significantly larger than the grain size of the CVD-tungsten bulk layer grown on the ALD-tungsten layer deposited by using $SiH_4$ as the reaction gas. As shown in FIG. 4, if the tungsten layer has a larger grain size, the resistivity of the tungsten layer can be reduced on the same thickness condition thereof. For instance, if a tungsten bulk layer is grown from an ALD-tungsten layer deposited by using $B_2H_6$ as a reaction gas, the resistivity of a stacked structure including the ALD-tungsten layer with a thickness of about 10 nm and the CVD-tungsten layer with a thickness of about 200 nm may be reduced by about 20% as compared with the resistivity of a stacked structure in which a tungsten bulk layer is grown on a ALD-tungsten layer deposited by using $SiH_4$ as a reaction gas.

In the meantime, if the ALD-tungsten layer is deposited by using $B_2H_6$ as the reaction gas, the deposition rate of the ALD-tungsten layer is of about 2.5 to 3 Å/cycle, and if the ALD-tungsten layer is deposited by using $SiH_4$ as the reaction gas, the deposition rate of the ALD-tungsten layer is of about 10 Å/cycle. That is, the deposition rate for the ALD-tungsten layer may be lowered if the ALD-tungsten layer is only deposited by using $B_2H_6$ as the reaction gas. For this reason, according to the present invention, after sequentially depositing the first and second tungsten layers 25 and 26 by using $SiH_4$ and $B_2H_6$, respectively, the third tungsten layer 27, that is, the tungsten bulk layer is deposited on the second tungsten layer 26. In this case, the metal wiring 28 having the large-sized grain can be obtained. Therefore, it is possible to reduce the resistance of the metal wiring 28. In addition, since the second tungsten layer 26 is deposited on the first tungsten layer 25 by using $B_2H_6$ as the reaction gas after rapidly depositing the first tungsten layer 25 by using $SiH_4$ as the reaction gas, it is possible to rapidly obtain the tungsten layers having a desired thickness.

As described above, according to the present invention, the first and second tungsten layers 25 and 26 are sequentially deposited by using $SiH_4$ and $B_2H_6$ as a reaction gas, respectively. After that, the tungsten bulk layer is deposited on the second tungsten layer, thereby enlarging the grain size of the tungsten bulk layer. Therefore, the resistance of the metal wiring in the stacked structure can be reduced and the operational speed of the semiconductor device can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a metal wiring in a semiconductor device, the method comprising the steps of:
   i) depositing an interlayer dielectric film on a silicon substrate, the interlayer dielectric film having a contact hole for exposing a predetermined portion of the silicon substrate;
   ii) depositing a barrier layer on the interlayer dielectric film having the contact hole;
   iii) depositing, using an atomic layer deposition (ALD) technique, a first tungsten layer on the barrier layer by using $SiH_4$ or $Si_2H_6$ as a reaction gas;
   iv) depositing, using the ALD technique, a second tungsten layer on the first tungsten layer by using $B_2H_6$ as a reaction gas;
   v) depositing, using a chemical vapor deposition (CVD) technique, a third tungsten layer on the second tungsten layer resulting in the second and third tungsten layers having a combined specific resistance of less than about 12½ $\mu\Omega$-cm and resulting in completely filing over the contact hole with the third tungsten layer; and
   vi) selectively etching the third tungsten layer, the second tungsten layer, the first tungsten layer, and the barrier layer, thereby forming the metal wiring.

2. The method as claimed in claim 1, wherein the first and second tungsten layers are deposited in a thickness of about 1 to 10 nm.

3. The method as claimed in claim 1, further comprising a step of repeating steps iii) and iv) until the first and second tungsten layers have a desired thickness, respectively.

4. The method as claimed in claim 1, wherein one selected from the group consisting of $H_2$, $SIH_4$, and a mixture gas thereof is used as a reaction gas for the third tungsten layer.

5. The method as claimed in claim 1, wherein the first to third tungsten layers are deposited by using a W-containing gas as a source gas therefor, and the W-containing gas is one selected from the group consisting of $WF_6$, $WCl_6$, $WBr_6$, $W(CO)_6$, $W(C_2H_2)_6$, $W(PF_3)_5$, $W(allyl)_3$, $(C_2H_5)WH_2$, $[CH_3(C_5H_4)]_2WH_2$, $(C_2H_5)W(CO)_3(CH_3)$, $W(butadiene)_3$, $W(methylvinyl-ketone)_3$, $(C_5H_5)HW(CO)_3$, $(C_7H_8)W(CO)_3$, and $(1,5\text{-COD})W(CO)_4$, wherein COD is 1,5 cyclooctadiene.

6. The method as claimed in claim 1, wherein $SiH_4$ or $Si_2H_6$ is either gas or plasma.

7. The method as claimed in claim 1, wherein $B_2H_6$ is either gas or plasma.

8. The method as claimed in claim 1 wherein step iii) comprises
   iii-a) dosing with the $SiH_4$ reactant gas;
   iii-b) purging the $SiH_4$ reactant gas;
   iii-c) dosing with $WF_6$ gas;
   iii-d) purging the $WF_6$ gas; and
   iii-e) repeating sequentially the steps of iii-a), iii-b), iii-c), and iii-d) until a desired thickness of the first tungsten layer is obtained.

9. The method as claimed in claim 1 wherein step iii) comprises
   iii-a) dosing with the $Si_2H_6$ reactant gas;
   iii-b) purging the $Si_2H_6$ reactant gas;
   iii-c) dosing with $WF_6$ gas;
   iii-d) purging the $WF_6$ gas; and
   iii-e) repeating sequentially the steps of iii-a), iii-b), iii-c), and iii-d) until a desired thickness of the first tungsten layer is obtained.

10. The method as claimed in claim 1 wherein step iv) comprises
    iv-a) dosing with the $B_2H_6$ reactant gas;
    iv-b) purging the $B_2H_5$ reactant gas;
    iv-c) dosing with $WF_6$ gas;
    iv-d) purging the $WF_6$ gas; and
    iv-e) repeating sequentially the steps of iv-a), iv-b), iv-c), and iv-d) until a desired thickness the second tungsten layer is obtained.

11. A method for forming a metal wiring in a semiconductor device, the method comprising the steps of:
    i) depositing an interlayer dielectric film on a silicon substrate, the interlayer dielectric film having a contact hole for exposing a predetermined portion of the silicon substrate;
    ii) depositing a barrier layer on the interlayer dielectric film having the contact hole;
    iii) depositing, using an atomic layer deposition (ALD) technique, a first ALD tungsten layer on the barrier layer by using a first reaction gas selected from the group consisting of $SiH_4$ and $Si_2H_6$;
    vi) depositing, using the ALD technique, a second ALD tungsten layer on the first ALD layer by using a $B_2H_6$ reaction gas wherein the second ALD tungsten layer is deposited directly on top of the first ALD tungsten layer;
    v) depositing, using a chemical vapor deposition (CVD) technique, a CVD tungsten layer directly on top of the second ALD tungsten resulting in the second ALD tungsten layer and the CVD tungsten layer having a combined specific resistance of less than about 12½ $\mu\Omega$-cm layer and resulting in completely filling over the contact hole with the CVD tungsten layer; and
    vi) selectively etching the CVD tungsten layer, the second ALD tungsten layer, the first ALD tungsten layer, and the barrier layer, thereby forming the metal wiring.

12. The method as claimed in claim 11 wherein the $B_2H_6$ reaction gas is either gas or plasma.

13. The method as claimed in claim 11 wherein a reaction gas to deposit the CVD tungsten layer is selected from the group consisting of $H_2$, $SiH_4$, and a mixture gas thereof.

14. The method as claimed in claim 11 wherein the first and second ALD tungsten layers and the CVD tungsten layer are deposited by using a W-containing gas as a source gas therefor, and the W-containing gas is one selected from the group consisting of $WF_6$, $WCl_6$, $WBr_6$, $W(CO)_6$, $W(C_2H_2)_6$, $W(PF_3)_6$, $W(allyl)_3$, $(C_2H_5)WH_2$, $[CH_3(C_5H_4)]_2WH_2$, $(C_2H_5)W(CO)_3(CH_3)$, $W(butadiene)_3$, $W(methylvinyl-ketone)_3$, $(C_5H_5)HW(CO)_3$, $(C_7H_8)W(CO)_3$, and $(1,5COD)W(CO)_4$, wherein COD is 1,5 cylooctadiene.

15. A method for forming a metal wiring in a semiconductor device, the method comprising the steps of:
  i) depositing an interlayer dielectric film on a silicon substrate, the interlayer dielectric film having a contact hole for exposing a predetermined portion of the silicon substrate;
  ii) depositing a barrier layer on the interlayer dielectric film having the contact hole;
  iii) depositing, using a atomic layer deposition (ALD) technique, a first tungsten layer on the barrier layer by using a first reaction gas selected from the group consisting of $SiH_4$ and $Si_2H_6$;
  iv) depositing, using the ALD technique, a second tungsten layer on the first tungsten layer by using a $B_2H_6$ reaction gas;
  v) depositing, using a chemical vapor deposition (CVD) technique, a third tungsten layer on the second tungsten layer resulting in the second and third tungsten layers having a combined specific resistance of less than about 12½ μΩ-cm and resulting in filling over the contact hole with the third tungsten layer; and
  vi) selectively etching the third tungsten layer, the second tungsten layer, the first tungsten layer, and the barrier layer, thereby forming the metal wiring.

16. The product by process made from the method as claimed in claim 15 wherein the first reactant gas is $SiH_4$.

17. The product by process made from the method as claimed in claim 15 wherein the first to third tungsten layers are deposited by using a W-containing gas as a source gas therefor, and the W-containing gas is one selected from the group consisting of $WF_6$, $WCl_6$, $WBr_6$, $W(CO)_6$, $W(C_2H_2)_6$, $W(PF_3)_6$, $W(allyl)_3$, $(C_2H_5)WH_2$, $[CH_3(C_5H_4)]_2WH_2$, $(C_2H_5)W(CO)_3(CH_3)$, $W(butadiene)_3$, $W(methylvinylketone)_3$, $(C_5H_5)HW(CO)_3$, $(C_7H_8)W(CO)_3$, and $(1,5\text{-}COD)W(CO)_4$, wherein COD is 1,5 cylooctadiene.

18. A product by process made from a method for forming a metal wiring in a semiconductor device, the method comprising the steps of:
  i) depositing an interlayer dielectric film on a silicon substrate, the interlayer dielectric film having a contact hole for exposing a predetermined portion of the silicon substrate;
  ii) depositing a barrier layer on the interlayer dielectric film having the contact hole;
  iii) depositing using an atomic layer deposition (ALD) technique to deposit a first tungsten layer on the barrier layer by using a first reaction gas selected from the group consisting of $SiH_4$ and $Si_2H_6$;
  iv) depositing using the ALD technique to deposit a second tungsten layer on the first tungsten layer by using a $B_2H_6$ reaction gas;
  v) depositing using a chemical vapor deposition (CVD) technique to deposit a third tungsten layer on the second tungsten layer resulting in the second and third tungsten layers having a combined specific resistance of less than about 12½ μΩ-cm and resulting filling over the contact hole with the third tungsten layer; and
  vi) selectively etching the third tungsten layer, the second tungsten layer, the first tungsten layer, and the barrier layer, thereby forming the metal wiring.

19. The product by process made from the method as claimed in claim 18 wherein a reaction gas for the third tungsten selected from the group consisting of $H_2$, $SiH_4$, and a mixture gas thereof.

20. The product by process made from the method as claimed in claim 18 wherein the first to third tungsten layers are deposited by using a W-containing gas as a source gas therefor, and the W-containing gas is one selected from the group consisting of $WF_6$, $WCl_6$, $WBr_6$, $W(CO)_6$, $W(C_2H_2)_6$, $W(PF_3)_6$, $W(allyl)_3$, $(C_2H_5)WH_2$, $[CH_3(C_5H_4)]_2WH_2$, $(C_2H_5)W(CO)_3(CH_3)$, $W(butadiene)_3$, $W(methylvinylketone)_3$, $(C_5H_5)HW(CO)_3$, $(C_7H_8)W(CO)_3$, and $(1,5\text{-}COD)W(CO)_4$, wherein COD is 1,5 cylooctadiene.

* * * * *